United States Patent [19]

Adair

[11] Patent Number: 4,773,502

[45] Date of Patent: Sep. 27, 1988

[54] ENCLOSURE FOR LOUDSPEAKER SYSTEMS

[75] Inventor: William A. Adair, Prospect Heights, Ill.

[73] Assignee: Teledyne Industries, Inc., Los Angeles, Calif.

[21] Appl. No.: 3,555

[22] Filed: Jan. 15, 1987

[51] Int. Cl.[4] .............................................. H05K 5/00

[52] U.S. Cl. .................................. 181/149; 181/144; 181/199

[58] Field of Search ............... 181/144, 147, 149, 199; 312/7.1, 7.2, 108, 257 A, 257 R, 263, 264, 296; 413/9; 381/87-90, 189

[56] References Cited

U.S. PATENT DOCUMENTS 3,343,896 9/1967 Mangels et al. ...................... 312/7.2

3,391,754 7/1968 Montanaro .......................... 181/149

4,451,711 5/1984 Jackson ............................ 312/7.1 X

*Primary Examiner*—B. R. Fuller

*Attorney, Agent, or Firm*—Lockwood, Alex, FitzGibbon & Cummings

[57] ABSTRACT

A hermetically sealed speaker enclosure assembled from pieces that can be shipped economically in compact knocked-down condition. The mating surfaces at the edges and margins of the assembled pieces are hermetically sealed by gaskets clamped therebetween. Some of the gaskets can be in the form of bands of compressible elastic material stretched around the peripheral edges of certain pieces or panels and seated in connecting grooves in the peripheral edges. Other of the gaskets are in the form of individual lengths of compressible material seated in certain of the borders or marginal edges. Appropriate fasteners are used to secure the pieces together in hermetically sealed relationship. Assembly of the speaker enclosure can be economically made at the place of installation of the speaker components.

6 Claims, 2 Drawing Sheets

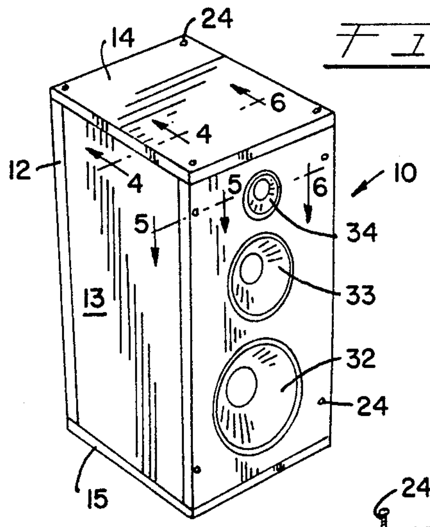
Fig-1
Fig-6
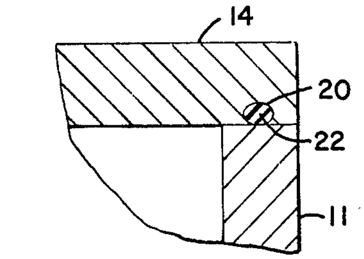
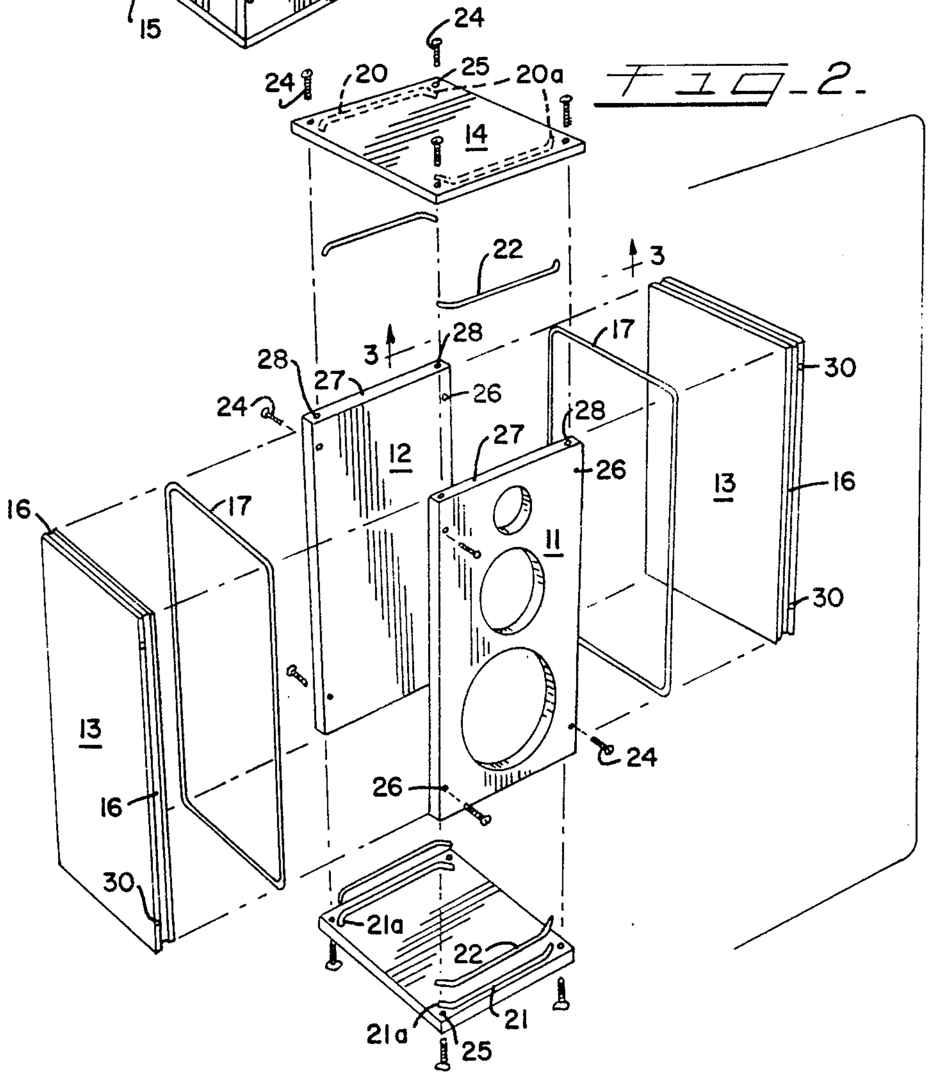
Fig-2

FIG-3-
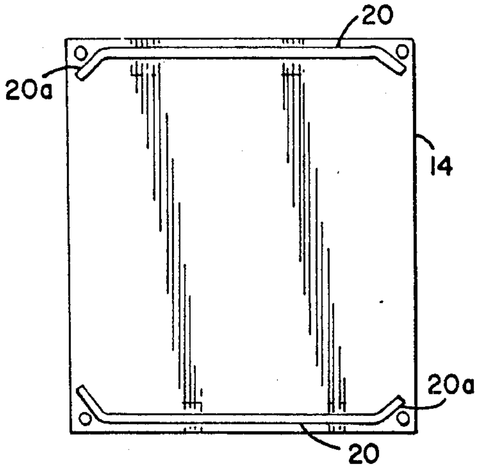
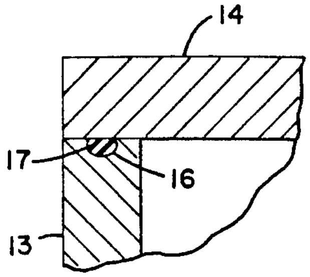
FIG-4-
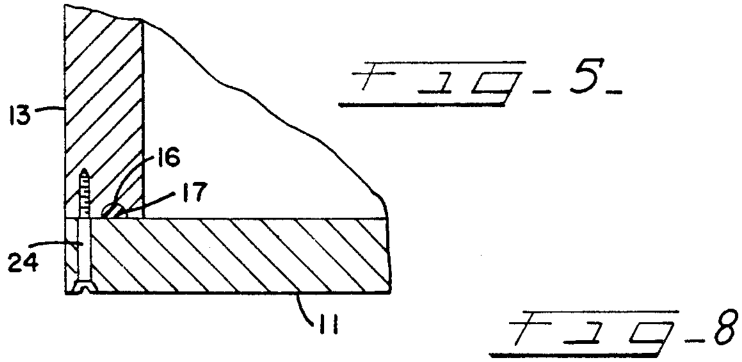
FIG-5-
FIG-8-
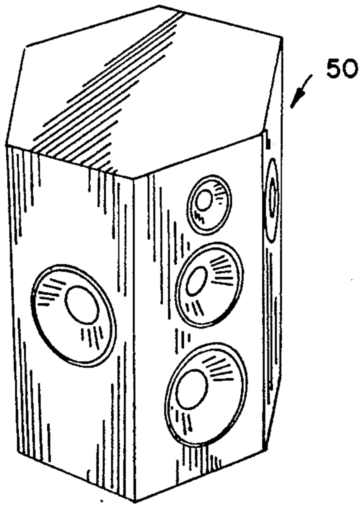
FIG-7-
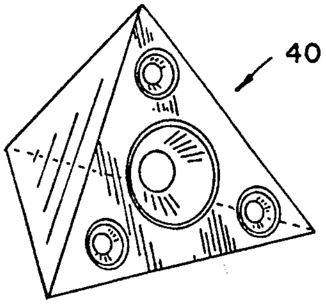

ENCLOSURE FOR LOUDSPEAKER SYSTEMS

The present invention relates generally to new and useful improvements in enclosures for loudspeaker or sound reproduction systems. More particularly, the invention relates to such enclosures which are composed of a plurality of wall pieces, gaskets and fasteners which can be shipped in knocked-down condition and readily assembled by relatively unskilled persons so as to make or complete hermetically sealed enclosures for speakers or drivers and other related components.

In high quality loudspeaker or sound reproduction systems the enclosures for the speakers or drivers and other internal components in addition to constituting housings or containers also contribute importantly to the acoustic qualities of the systems. Further, there is considerable support by those persons concerned with high quality sound reproduction systems (i.e. audiophiles) in the belief that the enclosures used in such systems should be of a type that are hermetically sealed when assembled.

High quality loudspeaker and sound reproduction systems are manufactured and marketed on a quantity production basis in both completed form ready for use and in kit form for assembly by the so-called "do it yourself" trade. In either case, the enclosures for the speakers or drivers have been generally provided to the manufacturers or to the do it yourself trade in assembled condition. Because of the high bulk to density ratio of such completed or assembled enclosures, the shipping and handling expenses attendant thereto have been substantial making long distance transportation prohibitive.

The object of this invention generally stated is the provision of hermetically sealed enclosures for speakers and related components of sound reproduction systems wherein the component pieces forming the sides or faces of the enclosure are hermetically sealed or joined at the mating edges or surfaces by gaskets permitting the enclosures to be economically shipped or transported long distances in knocked-down condition and easily assembled with fasteners of known type.

Stated in another way, an important object of the invention is the provision of enclosures for high quality sound reproduction or loudspeaker systems which can be packed in compact condition for handling and shipping and then readily assembled into hermetically sealed enclosures either at a site where the sound reproducing units (i.e. speakers and related components) are being manufactured on a quantity production basis or at the home or work shop of a do-it-yourself person.

Another important object of the invention is the provision of knocked-down enclosures for high quality sound reproduction systems which are free from the following objectionable features associated with known knocked-down type enclosures such as lack of rigidity, unsightly exteriors, undesirable vibrations and rattles, and air leaks at the seams or joints.

Certain other objects of the invention will be obvious and appear hereinafter to those skilled in the art in light of the following description of a presently preferred and alternative embodiments of the invention taken with the accompanying drawings wherein:

FIG. 1 is a perspective view of a regular hexahedron speaker enclosure made in accordance with the present invention;

FIG. 2 is an exploded view of the enclosure shown in FIG. 1;

FIG. 3 is a bottom plan view of the top piece of the enclosure shown in FIGS. 1 and 2;

FIGS. 4, 5 and 6 are enlarged fragmentary detailed sectional views taken on lines 4—4, 5—5 and 6—6, respectively of FIG. 1;

FIG. 7 is a perspective view of a tetrahedron enclosure formed in accordance with the present invention for a loudspeaker system; and FIG. 8 is a perspective view of an octahedron enclosure formed in accordance with the present invention for a sound reproduction or loudspeaker system.

Referring to FIG. 1, a speaker enclosure is indicated generally at 10 comprised of six separate pieces including a front side or panel 11 (usually referred to as the baffle), a back side or panel 12, side panels 13—13, a top piece or panel 14 and a bottom piece or wall 15.

The component pieces or panels 11-15 may be formed from various materials having the appropriate acoustical, structural, machinable, and aesthetic properties, including natural and synthetic wood, plastics, metals and combinations or laminations of one or more of such materials. By way of example, the sides or pieces 11-15 may be formed from sheets of compressed wood particles having a veneer lamination on the exterior surface. Sheets of such compressed wood material having a thickness of approximately 1 inch and a density of approximately 42 pounds per cubic foot have been found to be acceptable. Such sheet or panel material has high dimensional stability and good acoustic properties and can be economically mass produced with a high degree of accuracy.

The present invention is concerned with improvements in the enclosures for the sound reproduction and loudspeaker systems and not with improvements of the other components thereof such as the speakers or drivers, crossovers, passive radiators, internal dampening devices and internal bracing.

As shown in FIGS. 2, 4 and 5, the peripheral edges of the side panels 13 are provided with interconnecting semi-circular grooves 16. Gaskets 17—17 in the form of bands formed from compressible, elastic, materials either synthetic or natural are confined and seated in the grooves 16. In their uncompressed condition the cross sectional dimension of the gaskets 17 in relationship to the depths of the grooves 16 is such that a substantial portion of the gaskets 17 protrude or lie outside of the confines of the recesses or grooves 16.

It will be seen that when the component pieces 11-15 are assembled as shown in FIG. 1, each gasket 17 acts as a sealant between four pairs of mating edges or surfaces with each pair including a peripheral edge of a side panel 13 and a marginal edge surface of one of the front panel 11, back panel 12, top panel 14 or bottom panel 15, respectively. There remain to be sealed the four pairs of mating edges or surfaces between the top and bottom peripheral edges of the front and rear panels or sides 11 and 12, respectively, and the opposing marginal edges or surfaces of the top and bottom sides or panels 14 and 15. In order to provide for the hermetic sealing between these four remaining pairs of mating edges or surfaces, longitudinal grooves 20—20 (FIGS. 2 and 6) are formed in the front and rear underside marginal surfaces or edges of the top panel 14 and corresponding grooves 21—21 are formed in the front and rear marginal surfaces or edges of the bottom panel 15. Preferably, the ends of these grooves 20 and 21 are extended into angular end portions 20*a*—20*a* and 21*a*—21*a* respectively. Lengths or pieces of gasket material 22 are inserted in the grooves 20—20 and 21—21. These gaskets 22 may be frictionally retained in their seated positions in the grooves 20 and 21 as a result of their resilence or they may be positively retained in position such as by use of cement or adhesive of known type. One type of material from which the gaskets 17 and 22 may be formed is Neoprene.

In order to permit the convenient and accurate assembly of the enclosures 10 by means of screw fasteners 24—24 of known type, each of the top and bottom panels 14 and 15 is provided with through holes or openings 25—25 at the corners while each of the front and rear sides or panels 11 and 12 is likewise provided with through holes 26—26 adjacent their corners and in additional intermediate locations as needed. In the mating peripheral edges or surfaces 27—27 that mate with the through holes 25—25 pilot holes 28—28 are drilled in alignment or registration with the respective through holes 25. Likewise, each of the mating peripheral edges or surfaces of the side panels 13 which mate with the marginal edges of the front and rear panels 11 and 12 are provided with pilot holes 30—30 which register or align with the through holes 26—26.

By means of the prepared aligned and registering through holes and pilot holes, screw fasteners of the type represented by fastener 24 in FIG. 5 may be readily installed so as to complete the assembly of the enclosure 10 in both a convenient, rapid and accurate manner with a high degree of resulting rigidity. The completed assembly of the enclosure 10 may be preceded by the installation of speakers such as woofers 32 and 33 and a tweeter 34 in the baffle or front panel 11, or not as suits assembly conditions.

The utility of the invention as embodied in the enclosure 10 will be readily appreciated by those skilled in the art. For example, in the case of a manufacturer of loudspeaker systems ready for use, the various sides and panels may be purchased from a distant supplier who forms stacks or bundles of the corresponding sides and panels and then ships the same to the loudspeaker system manufacturer. It will be appreciated that shipping costs are minimized due the compact knocked-down condition in which the components of the enclosures are shipped. Furthermore, since the enclosure panels are in the form of unfinished goods they will usually carry minimum or low shipping rates.

On the other hand, do-it-yourself persons will be able to order loudspeaker system kits and obtain the components for the enclosure 10 in knocked-down condition from one source and the speakers and other components from the same or a different source. Since all of the through holes and pilot holes are already in place the do it yourself person will be able to readily assembly an enclosure without making costly and damaging mistakes as would otherwise be the case. For example, it will be noted that all of the through holes and pilot holes and the corresponding fasteners 24 are located on the exterior side of the gaskets 17, 20 and 21. By so locating the fasteners and their respective through holes and pilot holes optimum hermetic seals can be formed at the mating surfaces or edges when the screws are drawn up tight. However, if the through holes and pilot holes were not accurately preformed by machine in production, a do it yourself person might very well damage a panel by inaccurately drilling a hole and installing a screw fastener.

Similarly, internal fasteners of known type may be successfully used to effect optimum hermetic seals and additionally provide a fastener-free external appearance. Such assembly from the interior can be readily achieved by gaining internal access through the speaker openings.

For purposes of illustration, in FIG. 7 a loudspeaker enclosure is indicated generally at 40 in the form of a tetrahedron enclosure which may be assembled from four sides with the mating edges and surfaces hermetically sealed together following the same construction principles described above in connection with the enclosure 10 in FIGS. 1-6. Likewise, in FIG. 8 an octahedron loudspeaker enclosure is indicated generally at 50, the sides and panels of the enclosure for which may be assembled in hermetically sealed condition also following the principles of construction shown and described in connection with enclosure 10 in FIGS. 1-6.

It will be appreciated that those skilled in the art will be able to make certain changes in the details of construction in the production of a speaker enclosure from the specific details of the speaker 10. For example, instead of using wood screws for assembly purposes, other known types of fasteners, both internal and external, may be utilized.

What is claimed is:

1. A hermetically sealed speaker enclosure adapted to be shipped in knocked-down condition and to be assembled at the time the speaker components are installed therein, comprising, in combination:

a plurality of enclosure-forming panels having mating edge-surfaces at peripheral edges and margins thereof which can be stacked together in compact condition in one or more stacks and assembled into an enclosure with the mating edge surfaces of the panels hermetically sealed together, said panels having unobstructed inner and outer surfaces permitting surface-to-surface stacking engagement;

a plurality of gaskets disposed in at least one-half of said mating edge surfaces providing hermetic seals between mating edge surfaces, and fastener means securing said panels and gaskets together in hermetically sealed condition.

2. The hermetically sealed speaker enclosure of claim 1 wherein the peripheral edges of certain of said panels have interconnecting grooves formed therein and a portion of said gaskets are in the form of bands of compressible elastic material stretched around said peripheral edges and seated in said connecting grooves therein.

3. The hermetically sealed speaker enclosure of claim 1 wherein certain of the mating marginal edge surfaces of a portion of said panels have discrete grooves therein, wherein a portion of said gaskets are located in said discrete grooves.

4. The hermetically sealed speaker enclosure of claim 1 wherein:

the peripheral edges of certain of said panels have interconnecting grooves formed therein and a portion of said gaskets are in the form of bands of compressible elastic material stretched around said peripheral edges of said certain panels and seated in said connecting grooves therein; and certain of said panels have discrete grooves formed in marginal edges and wherein another portion of said gaskets are seated.

5. A knocked-down kit from which a hermetically sealed speaker enclosure may be assembled, comprising, in combination:

a plurality of enclosure-forming panels having mating edge surfaces at peripheral edges and margins thereof compactly stacked together, said panels having unobstructed inner and outer surfaces in surface-to-surface stacking engagment;

a plurality of gaskets to be disposed in one-half of the mating edge surfaces of said panels; and fastener means for securing said panels and gaskets together in sealed relationship.

6. A plurality of hermetically sealed speaker enclosures adapted to be shipped as a plurality of compact kits in knocked-down condition to be assembled at the time the speaker components are installed therein, comprising, combination:

pluralities of different enclosure-forming panels having mating edge surfaces at peripheral edges and margins thereof which can be compactly stacked with like panels in each stack and when unstacked can be separated and assembled into said plurality of enclosures with the mating edges of the panels forming each enclosure hermetically sealed together said panels having unobstructed inner and outer surfaces permitting surface-to-surface stacking engagement;

a plurality of gaskets to be disposed in at least one of each of said mating edges of each enclosure; and fastener means securing said panels in each enclosure together in hermetically sealed relationship.

* * * * *